United States Patent [19]

Padmanaban et al.

[11] Patent Number: 5,595,855
[45] Date of Patent: Jan. 21, 1997

[54] RADIATION SENSITIVE COMPOSITION

[75] Inventors: Munirathna Padmanaban; Yoshiaki Kinoshita; Natsumi Suehiro; Takanori Kudo; Seiya Masuda; Yuko Nozaki; Hiroshi Okazaki; Georg Pawlowski, all of Saitama, Japan

[73] Assignee: Hoechst Japan Limited, Tokyo, Japan

[21] Appl. No.: 390,045

[22] Filed: Feb. 17, 1995

[30] Foreign Application Priority Data

Feb. 25, 1994 [JP] Japan ................................. 6-028322

[51] Int. Cl.$^6$ ........................................................ G03C 1/72
[52] U.S. Cl. .................... 430/270.1; 430/260; 430/281.1; 430/283.1; 430/286.1; 430/288.1
[58] Field of Search ................................. 430/260, 270.1, 430/281.1, 283.1, 286.1, 288.1

[56] References Cited

U.S. PATENT DOCUMENTS 5,286,602  2/1994  Pawlowski et al. .................. 430/270.1
5,350,660  9/1994  Urano et al. ......................... 430/270.1
5,352,564  10/1994 Takeda et al. ....................... 430/270.1
5,403,695  4/1995  Hayase et al. ....................... 430/270.1

*Primary Examiner*—Hoa Van Le
*Attorney, Agent, or Firm*—Foley & Lardner

[57] ABSTRACT

A chemically amplified radiation sensitive composition comprising: (a) a copolymer such as poly(4-hydroxystyrene-co-styrene), (b) a dissolution inhibitor such as polyacetal or (b') a crosslinking agent, (c) a radiation sensitive compound capable of generating an acid upon exposure to actinic radiation, (d) a radiation sensitive base capable of stabilizing the width of lines throughout steps from exposure to post-exposure bake treatment, and (e) a solvent for dissolving the components (a) to (d), can realize fine lines and spaces down to 0.22 microns, for example, using KrF laser, and possesses excellent heat and etch resistance and adhesiveness to substrates, and produces patterns with low standing waves arising due to substrate reflectiveness of exposed light.

18 Claims, No Drawings

RADIATION SENSITIVE COMPOSITION

BACKGROUND OF THE INVENTION

1. Field of the Invention

The present invention relates to a radiation sensitive composition comprising as essential components a) a polymer (a matrix resin) which is insoluble in water but is soluble in or at least swellable in an aqueous alkaline solution, b) a compound cleavable with an acid or b') a compound crosslinkable using an acid, c) a compound capable of forming an acid upon exposure to actinic radiation, and d) a radiation sensitive base, for stabilizing the width of lines, in combination with the components a), b), and c) or alternatively the components a), b'), and c).

Further, the present invention relates also to a photoresist and an electronic component produced from the above composition, production of a printing plate, and a radiation sensitive copying material.

2. Description of the Related Art

An ever-increasing tendency toward a reduction in structural dimension (for example, in the production of chips) has necessitated an improvement in a lithographic technique in a region of less than 1 µm. In such a technique, high energy UV light, electron beams, and X rays are used for exposure. The improvement in the lithography has brought about a change in requirements which radiation sensitive compositions should meet. These requirements are described in, for example, C. G. Wilson, "Organic Resist Materials-Theory and Chemistry" [Introduction to Microlithography, Theory, Materials, and Processing, edited by L. F. Thompson, C. G. Wilson, M. J. Bowden, ACS Symp. Ser., 219, 87 (1983), American Chemical Society, Washington]. Specifically, there is an increasing demand for radiation sensitive composition which are preferably sensitive to a wide region of spectrum and, hence, applicable to not only the conventional photolithography but also advanced lithographic techniques, such as near UV, far UV, deep UV, electron beam, or X-ray lithography, without sacrificing the sensitivity.

A chemically sensitized resist, which has been for the first time disclosed by Ito et al. [H. Ito and C. G. Wilson, Polym. Eng. Sci., Vol. 23, 1012 (1983)], has been extensively used for the production of a radiation sensitive mixture having a high sensitivity to high energy radiation. In general, protons generated during irradiation are catalytically reacted at room temperature or a temperature above room temperature depending upon the chemical composition of the radiation sensitive mixture. This catalytic reaction imparts a high sensitivity to the radiation sensitive mixture.

In the semiconductor industry, a radiation sensitive composition (hereinafter often referred to as "resist material" or "resist blend") should be developable with an alkaline solution. Preferably, the alkaline solution is an organic base solution, such as 2 to 3% aqueous solution of tetramethylammonium hydroxide (TMAH).

A novolak resin or a homopolymer or a copolymer of vinyl phenol is best suited for this purpose. For photolithography, the use of novolak is limited to the case where the radiation has a longer wavelength than 300 nm because novolak has a high absorption in shorter wavelengths. Adverse effect of absorbance causes the resist image to have such a profile that the wall is extremely inclined. The vinylphenolic resin can be used in deep UV lithography when it has a combination of desired dissolution properties with high optical transparency. Poly(4-vinylphenol), when used alone, exhibits a considerably high dissolution rate and, therefore, as such, is not suitable for the above purpose. One of the methods for lowering the dissolution rate to a desired value is to copolymerize 4-vinylphenol with other alkyl-substituted phenols. Such copolymers are described in European Patent Nos. 0307752 and 0307751 and Japanese Patent Laid-Open No. 166105/1990. Other copolymers of 4-hydroxystyrene, although is independently of the solubility thereof in an aqueous alkaline solution, are described by Maruzen Petrochemical Co., Ltd. in "Kobunshi," Vol. 38,571 (1989).

Basically, alkali-soluble poly(4-vinylphenol) and copolymers thereof may be used as a radiation sensitive composition by two methods. One of the methods is to add a protective group, cleavable with an acid, to hydroxyl groups in such a manner that the protective group is added to all the hydroxyl groups to render the polymer insoluble or alternatively to part of the hydroxyl groups. A mixture of such a protected polymer and a photo-acid generator, which will be described later, is prepared. This mixture, when irradiated with actinic radiation, generates an acid which eliminates the protective group sensitive to the acid. The protective group include tert-butyloxycarbonyloxy or its derivatives (Ito et al., J. Photopolym. Sci. & Tech., Vol. 6, No. 4, 1993, p. 547) and a tetrahydropyranyl group (Hattori et al., J. Photopolym. Sci. & Tech., Vol. 6, No. 4, 1993, p. 497). Another method is to mix the alkali-soluble poly(4-vinylphenol) or copolymers thereof with a dissolution inhibitor sensitive to an acid, such as polyacetals described in Pawlowski et al., J. Photopolym. Sci. & Tech., Vol. 15, No. 1 (1992) p. 55. This mixture is insoluble in an aqueous alkaline developer before exposure. The exposure thereof to deep UV light, however, brings about cleavage of the dissolution inhibitor, rendering the mixture soluble in the alkaline developer.

Compounds capable of generating an acid upon exposure to actinic radiation, for example, onium salts, such as a phosphonium salt, a sulfonium salt, and an iodonium salt of non-nucleophilic acids, such as $HSbF_6$ and $HAsF_6$, have hitherto been used as described in J. V. Crivello, Polym. Eng. Sci., 23 (1983) 953. Further, halogen compounds, particularly trichloromethyltriazine derivatives or trichloromethyloxadiazole derivatives, o-quinonediazide sulfonylchloride, o-quinonediazide-4-sulfonate, a combination of an organometal/an organohalogen, bis(sulfonyl)diazomethane, sulfonylcarbonyldiazomethane (DE-A 3,930,087), and nitrobenzyl tosylate are recommended in F. M. Houlian et al., SPIE Proc., Adv. in Resist Tech. and Proc. 920 (1988) 67.

The radiation sensitive composition may contain, in addition to the above compounds, other additives for enhancing the contrast and controlling a reduction in line width.

It is important for the radiation sensitive composition to have high transparency, good adhesion to a substrate, good pattern profile after development, low standing waves, good heat stability, and etching resistance. A single mixture constituting such a composition is unavailable. Therefore, resist materials, which can overcome the above problems, can be put to practical use, and have high sensitivity, have been desired in the art.

An object of the present invention is to provide both positive and negative radiation sensitive compositions, particularly resist materials, which have high transparency to deep UV light, such as KrF excimer laser beam, high sensitivity to these light sources, electron beams, and X rays, excellent heat resistance, excellent adhesion to substrates, undergo no change in dimension of patterns with time, and can provide patterns with no standing wave even in fine lines and spaces of less than 0.3 microns.

SUMMARY OF THE INVENTION

According to an aspect of the present invention, there is provided a radiation sensitive composition comprising a) a copolymer represented by the general formula (1):

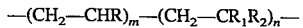
$$—(CH_2—CHR)_m—(CH_2—CR_1R_2)_n—$$

where R is a hydroxy- and further optionally alkyl-substituted aryl, where the hydroxyl group may be partially protected by an acid cleavable group, $R_1$ is hydrogen or a methyl group, $R_2$ is a phenyl, alkyl-substituted phenyl, halogenated phenyl, or acrylate group, and m and n are integers of 1 or more, b) a dissolution inhibitor represented by the general formula (2):

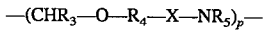
$$—(CHR_3—O—R_4—X—NR_5)_p—$$

where $R_3$ is an alkyl, aryl, or substituted aryl group, $R_4$ is an alkylene, cycloalkylene, alkene, or alkyne group, $R_5$ is an alkyl, alkene, alkyne, or cycloalkyl group, X is —OCO—, —CO—, or —NHCO—, and p is an integer of 1 or more, or b') a crosslinking agent such as hexamethylmelamine hexamethyl ether, c) a radiation sensitive compound capable of generating an acid upon exposure to actinic radiation, d) optionally a minor amount of a base, capable of degrading upon exposure to actinic radiation, useful for stabilizing the width of lines, and e) a solvent for dissolving the components a), b) or b'), c), and d).

When the component b) is selected, the composition is of positive working type, while when the component b') is selected, the composition is of negative working type.

Further, according to another aspect of the present invention, there is provided a method for forming a pattern comprising the steps of: exposing a film selectively to actinic radiation; heating the film; and developing the exposed film to remove the exposed area for a positive radiation sensitive composition or the nonexposed area for a negative radiation sensitive composition.

PREFERRED EMBODIMENTS OF THE INVENTION

The polymer used in the present invention is represented by the general formula (1):

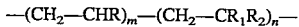
$$—(CH_2—CHR)_m—(CH_2—CR_1R_2)_n—$$

where R is a hydroxy- and further optionally alkyl-substituted phenyl or other aryls, where the hydroxyl group may be partially protected by an acid cleavable group, $R_1$ is hydrogen or a methyl group, $R_2$ is a phenyl, alkyl-substituted phenyl, halogenated phenyl, or acrylate group, and m and n are integers of 1 or more. In this case, R is preferably phenyl substituted with a hydroxyl group at the 4-position or phenyl substituted with a hydroxyl group and an alkyl group.

In the present specification, the alkyl is a $C_1$–$C_6$, preferably $C_1$–$C_3$ alkyl, unless otherwise specified.

The copolymer is particularly preferably a copolymer of 4-hydroxystyrene with styrene, for example, poly(4-hydroxystyrene-co-styrene) or poly(4-hydroxystyrene-com-ethylstyrene). In such a copolymer, the molar proportion of styrene may be 1 to 50 mol %. It is particularly preferably 5 to 20 mol % because the best resolution can be obtained. A copolymer having a styrene content exceeding 50% is not very useful because it has an excessively low glass transition temperature. The molecular weight $M_W$ is 2,000 to 200,000 Dalton, preferably 6,000 to 25,000 Dalton, and the degree of dispersion should be less than 2. Further, the hydroxyl group in R may be partially protected, for example, by a tert-butyloxycarbonyl, tetrahydropyranyl, or trialkylsilyl group.

The component b), i.e., polyacetal as a dissolution inhibitor, is represented by the general formula (2):

$$—(CHR_3—O—R_4—X—NR_5)_p—$$

where $R_3$ is an alkyl, aryl, or substituted aryl group, $R_4$ is an alkyl, cycloalkyl, or alkyne group, $R_5$ is an alkyl, alkene, alkyne, or cycloalkyl group, p is an integer of 1 or more, and X is —OCO—, —CO—, or —NHCO—. In this case, the cycloalkyl is, for example, cyclohexyl, and may be substituted with a $C_1$–$C_6$ alkyl, such as methyl or ethyl, dimethylamino, acetamide, amide, or a halogen, such as Cl, Br, or I. Still preferably, $R_3$ is phenyl, $R_4$ is ethylene, isopropylene, or branched butylene, $R_5$ is propyl, and X is —OCO—.

A polyacetal produced by transesterifying dimethylacetal of a corresponding urethane-alcohol component and a corresponding aldehyde in the presence of an acid catalyst is important from chemical viewpoint. The degree of condensation and the molecular weight distribution may be regulated by varying polycondensation conditions.

In the case of a negative resist material, the compound b) is replaced with compound b') which may be any compound (crosslinking agent) that is crosslinkable with the compound a) upon exposure to actinic radiation or in the subsequent step. Hexamethylmelamine and derivatives thereof are particularly useful. In this case, compounds having no absorption in UV region, particularly around 248 nm, are advantageous as the crosslinking agent.

The component c) may be any compound capable of generating an acid upon exposure to actinic radiation. Suitable examples of such acid generators include diazomethane compounds, iodonium salts, sulfonium salts, halides, and o-quinonediazidosulfonates. Preferred are compounds which can generate a sulfonic acid and have good heat stability and advantageous absorption properties around 248 nm. Examples of such compounds include diazomethane represented by the following formula:

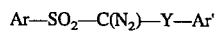
$$Ar—SO_2—C(N_2)—Y—Ar'$$

wherein Ar and Ar' which may be the same or different are a phenyl, chlorophenyl, alkylphenyl, or alkyl group and Y is —SO₂— or —CO—, and sulfonium sulfonate represented by the following formula:

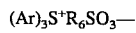
$$(Ar)_3S^+R_6SO_3—$$

wherein Ar is a substituted or unsubstituted phenyl group, and $R_6$ is an alkyl or fluorinated alkyl group. Bis-(4-chlorophenylsulfonyl)diazomethane is particularly preferred as the diazomethane. Examples of the sulfonium sulfonate include triphenylsulfonium alkylsulfonate, triphenylsulfonium alkyl- or halogen-substituted arylsulfonate, and triphenylsulfonium fluorinated-alkylsulfonate.

The compound d) is a radiation sensitive base. Particularly useful compounds as the compound d) include, for example, triphenylsulfonium hydroxide or triphenylsulfonium acetate represented by the following formula and derivatives thereof or diphenyliodonium hydroxide and derivatives thereof:

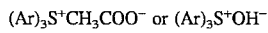

wherein Ar is a substituted or unsubstituted phenyl group. The amount of the base used varies depending upon absorption properties of the base. It varied also depending upon the amount of an acid generator used.

The solvent as the component e) should dissolve the above components and is not particularly limited so far as the resist material can be used. Specific preferred examples of the solvent include glycol ethers, such as ethylene glycol monomethyl ether, ethylene glycol monoethyl ether, and propylene glycol monomethyl ether, glycol ether acetates, such as ethylene glycol monoethyl ether acetate and propylene glycol monomethyl ether acetate (PGMEA), esters such as ethyl acetate, butyl acetate, and ethyl lactate, ketones, such as acetone, methyl ethyl ketone, cyclopentanone, and cyclohexanone, and aromatic hydrocarbons, such as toluene and xylene. In some cases, acetonitrile, dimethylformamide, dioxane, and the like may also be used. These solvents may be used alone or in the form of a mixture of two or more.

The total solid content of the composition may be in the range of from 10 to 50% by weight, preferably in the range of from 15 to 25% by weight. The term "solid" used herein intended to mean the compounds a) to d). The weight ratio of the compound a) to the compound b) or b') may be in the range of from 95:5 to 50:50, depending upon the molecular weight of the compound a) and the compound b) or b') and the dissolution properties of the compound a) in the aqueous alkaline developer. When the radiation sensitive composition of the present invention is used for pattern formation purposes, a uniform film can be formed on a substrate wafer such as silicon.

The rate of dissolution of the compound a) (copolymer) per se in the alkaline solution also determines the necessary ratio of the compound a) to the compound b). The ratio of the compound a) to the compound b) is particularly preferably in the range of from 80:20 to 60:40.

The amount of the compound c) may be varied in the range of from 0.2 to 5% by weight, preferably in the range of from 1 to 3% by weight, based on the total amount of the compounds a) and b). The amount of the compound c) determines also the necessary amount of the compound d). The molar amount of the compound c) is usually equal to or larger than that of the compound d).

Deep UV which is short-wavelength UV, such as KrF excimer laser, light sources which emit light having wavelengths in the range of from 200 to 500 nm, such as i-ray and g-ray, X-rays, electron bemas, and the like are preferably used as the actinic radiation for the composition of the present invention.

The formation of a pattern using the radiation sensitive composition of the present invention can be carried out, for example, by the following method. The composition of the present invention is coated on a substrate, such as a silicon wafer, to a thickness of 500 to 2000 nm. The resultant coating is baked by heating the coated substrate in an oven at 60° to 150° C. for 10 to 30 min or alternatively on a hot plate at 60° to 150° C. for 10 to 30 min for 1 to 2 min. Thus, a mask for forming a desired pattern is formed on a resist film, and the coating is then exposed to deep UV light having a wavelength of 300 nm or less at a dose of about 1 to 100 mJ/cm$^2$ and developed for 0.5 to 3 min using a developing solution, such as a 0.1 to 5% aqueous solution of tetramethylammonium hydroxide (TMAH), by immersion, spraying, paddling, or other conventional methods, thereby forming a desired pattern on the substrate.

EXAMPLES

The present invention will now be described in more detail with reference to the following examples. In the following examples, all "%" is by weight unless otherwise specified.

Reference Example 1 (Copolymer 1)

(1) Poly(hydroxystyrene-co-styrene)

43.791 g (0.27 mol) of p-acetoxystyrene (available from Hoechst Celanese Corporation), 3.125 g (0.03 mol) of styrene, and 300 ml of methanol were placed in a three-necked flask provided with a reflux condenser, a dropping funnel, and a mechanical agitator. The molar ratio of p-acetoxystyrene to styrene was 90:10. To the reaction mixture was added 2.5 g in total of 2,2'-azobis(2,4-dimethylvaleronitrile). The reaction mixture was first purged with nitrogen and then heated in an inert atmosphere to a reflux temperature (60°–70° C.). A reaction was allowed to proceed for 8 hr, and the resultant white solid precipitate was poured into n-hexane, and the solid matter was collected by filtration, washed with n-hexane, and dried in vacuo at 50° C. to give 44.64 g of poly(4-acetoxystyrene-co-styrene). The yield was 95.2%. The infrared spectrum of the copolymer thus obtained had at 1763 cm$^{-1}$ a peak derived from a carbonyl group of the copolymer. Further, the styrene content of the copolymer was calculated based on a proton NMR spectrum of the copolymer and found to be 10.2 mol %.

In the second step subsequent to the above first step, 40 g of the copolymer prepared in the above first step was mixed with 300 ml of methanol and 0.5 ml of 36% hydrochloric acid, and the mixture was refluxed with agitation at a constant rate. As a result, a transparent solution was obtained about 30 min after the initiation of the reaction. The hydrolysis reaction was carried out for 3 hr in total. The transparent solution was poured into ultrapure water to give a white precipitate of a copolymer poly(4-hydroxystyrene-co-styrene). The precipitate was collected by filtration and washed with pure water. The filtrate had pH 7. Washing with pure water was repeated until no trace of hydrochloric acid was found in the copolymer. The copolymer thus obtained was dried in vacuo (1 Torr) at 50° C. to a constant weight. The weight of the dried copolymer was 31 g. An infrared spectrum of the copolymer had no peak at 1763 cm$^{-1}$ but a new broad peak derived from a hydroxyl group at 3700 cm$^{-1}$. The weight average molecular weight and the number average molecular weight of the copolymer were measured by using gel-permeation chromatography and polystyrene standard and found to be 11544 and 7414, respectively. Other physical properties are given in Table 1.

Reference Example 2 (Copolymer 2)

The procedure of Reference Example 1 was repeated, except that the molar ratio of 4-acetoxystyrene to styrene in the starting material was varied to 95:5. The physical properties of the resultant copolymer are given in Table 1.

Reference Example 3 (Copolymer 3)

The procedure of Reference Example 1 was repeated, except that the molar ratio of 4-acetoxystyrene to styrene in the starting material was varied to 85:15. The physical properties of the resultant copolymer are given in Table 1.

Reference Example 4 (Copolymer 4)

The procedure of Reference Example 1 was repeated, except that the molar ratio of 4-acetoxystyrene to styrene in the starting material was varied to 80:20. The physical properties of the resultant copolymer are given in Table 1.

Reference Example 5 (Copolymer 5)

The procedure of Reference Example 1 was repeated, except that the molar ratio of 4-acetoxystyrene to styrene in the starting material was varied to 75:25. The physical properties of the resultant copolymer are given in Table 1.

Reference Example 6 (Copolymer 6)

The procedure of Reference Example 1 was repeated, except that the molar ratio of 4-acetoxystyrene to styrene in the starting material was varied to 70:30. The physical properties of the resultant copolymer are given in Table 1.

Reference Example 7 (PHS)

The procedure of Reference Example 1 was repeated, except that 4-acetoxystyrene alone was used as the monomer starting material. The physical properties of the resultant copolymer are given in Table 1.

TABLE 1

(physical properties of Copolymers 1 to 7)

| Co-polymer No. | Yield % | (b)Mw | Mw/Mn | (c)Tg | Absorbance at 248 nm (per μm of film) |
|---|---|---|---|---|---|
| 1 | 90 | 11544 | 1.56 | 166 | 0.165 |
| 2 | 90 | 19183 | 1.87 | 168 | 0.165 |
| 3 | 85 | 13654 | 1.76 | 161 | 0.152 |
| 4 | 87 | 11043 | 1.95 | 160 | 0.152 |
| 5 | 83 | 12500 | 2.00 | 160 | 0.148 |
| 6 | 80 | 14560 | 1.80 | 155 | 0.143 |
| PHS | 95 | 15000 | 1.90 | 178 | 0.170 |

Reference Example 8 (Polyacetal 1)

Synthesis of starting compound A (2-hydroxyethyl N-propylcarbamate)

88.062 g of ethylene carbonate and n-propylamine were mixed together first at 0° C. for 1 hr and then at 70° C. for 5 hr. The resultant viscous product was vacuum-distilled at 110° C. under 0.06 mbar to give Compound A. The yield was 142.75 g (97%).

73.585 g of Compound A and 76.085 g of benzaldehyde dimethylacetal were mixed together in a flask provided with a distilling apparatus for removing a methanol-xylene azeotrope and a dropping funnel. To the mixture was added 5 g of Amberlyst 15, a sulfonic acid-containing ion-exchange resin. The mixture was gradually heated to 130° C. As the reaction temperature increased, methanol was formed as a by-product which was removed, as an azeotrope with xylene, from the reaction mixture. Xylene was added in order to kept the xylene content of the reaction mixture constant. After the reaction for 6 hr, the reaction mixture was cooled to room temperature and filtered to remove Amberlyst 15, and xylene was removed on a rotary evaporator to give an oligomeric compound as a high viscous solution having a weight average molecular weight of about 2000 (as determined using polystyrene as a standard substance). The oligomeric compound thus obtained was further heated under reduced pressure (0.001 Torr) at 200° C. for 3 hr. The molecular weight of the final product varies depending upon the temperature and the reaction time. Thus, 101.6 g in total of poly(N,O-acetal) was obtained (yield: 90%). The weight average molecular weight of the resin was measured by means of GPC using polystyrene as a standard substance and found to be 7000. Polyacetals 1 having varied molecular weight could be produced by simply varying the reaction temperature and time.

Reference Example 9 (Polyacetal 2)

Synthesis of starting compound B

The procedure described above in connection with the synthesis of Compound A in Reference Example 1 was repeated, except that 102.09 g of 4-methyl-1,3-dioxolan-2-one was reacted with 59.11 g of propylamine to give Compound B. Compound B had a boiling point of 114°–115° C. (0.4 Torr). The yield was 159.6 g (99%).

The procedure described above in connection with the synthesis of Polyacetal 1 in Reference Example 1 was repeated, except that Compound B was reacted with benzaldehyde dimethylacetal to give Polyacetal 2. The yield was 90%, and the molecular weight was 6500.

Reference Example 10 (Polyacetal 3)

Synthesis of starting compound C

The procedure described above in connection with the synthesis of Compound A in Reference Example 1 was repeated, except that 116.12 g of 4-ethyl-1,3-dioxolan-2-one was reacted with 59.11 g of n-propylamine to give Compound C. Compound C had a boiling point of 105° C. (1 Torr). The yield was 173.5 g (99%).

The procedure described above in connection with the synthesis of Polyacetal 1 in Reference Example 1 was repeated, except that Compound C was reacted with benzaldehyde dimethylacetal to give Polyacetal 3. The yield was 92%, and the molecular weight was 6300.

Example 1

A resist composition was prepared according to the following composition.

| | |
|---|---|
| Copolymer 1 of Reference Example 1 | 5.85 g |
| Polyacetal 1 of Reference Example 8 | 3.15 g |
| α,α-Bis(p-chlorophenyl)diazomethane | 0.18 g |
| 0.1 mmol/g solution of triphenylsulfonium acetate in propylene glycol monomethyl ether acetate (PGMEA) | 2.76 g |
| Propylene glycol monomethyl ether acetate (PGMEA) | 18.50 g |

The mixture was agitated for not shorter than 1 hr, and the resultant resist solution was filtered through 0.5 and 0.2-μm filters to remove particles. The resist solution thus obtained was spin-coated on a silicon wafer (any semiconductor base material being usable), and the resultant coating was prebaked at a temperature of 130° C. for 60 sec. The thickness of the resist was 0.746 μm. The coated silicon base material thus obtained was selectively exposed to KrF excimer laser at 248.4 nm using a mask. The exposed, coated silicon base material was baked on a hot plate at 55° C. for 155 sec and developed with an alkaline developer (2.38 wt % tetramethylammonium hydroxide) for 60 sec, thereby dissolving and removing the exposed area alone. Thus, a positive pattern was obtained. The positive pattern had a wall angle of about 90°, the resolution of line and space was 0.24 µm, and the exposure energy was 50 mJ/cm².

Example 2

The procedure of Example 1 was repeated to prepare a resist composition according to the following formulation, and the same experiment as described in Example 1 was carried out.

| | |
|---|---|
| Copolymer 1 of Reference Example 1 | 4.08 g |
| Polyacetal 1 of Reference Example 8 | 2.43 g |
| α,α-Bis(p-chlorophenyl)diazomethane | 0.136 g |
| 0.1 mmol/g solution of triphenylsulfonium acetate in PGMEA | 2.09 g |
| PGMEA | 10.63 g |

The positive pattern had a wall angle of about 90°, the resolution of line and space was 0.24 µm, and the exposure energy was 52 mJ/cm².

Example 3

The procedure of Example 1 was repeated to prepare a resist composition according to the following formulation, and the same experiment as described in Example 1 was carried out.

| | |
|---|---|
| Copolymer 5 of Reference Example 5 | 3.750 g |
| Polyacetal 1 of Reference Example 8 | 1.607 g |
| α,α-Bis(t-butylphenyl)diazomethane | 0.107 g |
| 0.1 mmol/g solution of triphenylsulfonium acetate in PGMEA | 0.684 g |
| PGMEA | 4.604 g |

The positive pattern had a wall angle of about 87°, the resolution of line and space was 0.26 µm, and the exposure energy was 60 mJ/cm².

Example 4

The procedure of Example 1 was repeated to prepare a resist composition according to the following formulation, and the same experiment as described in Example 1 was carried out.

| | |
|---|---|
| Copolymer 6 of Reference Example 6 | 3.577 g |
| Polyacetal 1 of Reference Example 8 | 1.533 g |
| α,α-Bis(p-chlorophenyl)diazomethane | 0.102 g |
| 0.1 mmol/g solution of triphenylsulfonium acetate in PGMEA | 0.652 g |
| PGMEA | 5.873 g |

The positive pattern had a wall angle of about 87°, the resolution of line and space was 0.3 µm, and the exposure energy was 45 mJ/cm².

Example 5

The procedure of Example 1 was repeated to prepare a resist composition according to the following formulation, and the same experiment as described in Example 1 was carried out.

| | |
|---|---|
| Copolymer 4 of Reference Example 4 | 3.219 g |
| Polyacetal 1 of Reference Example 8 | 1.733 g |
| α,α-Bis(p-chlorophenyl)diazomethane | 0.099 g |
| 0.1 mmol/g solution of triphenylsulfonium acetate in PGMEA | 0.625 g |
| PGMEA | 5.771 g |

The positive pattern had a wall angle of 87°, the resolution of line and space was 0.25 µm, and the exposure energy was 54 mJ/cm².

Example 6

The procedure of Example 1 was repeated to prepare a resist composition according to the following formulation, and the same experiment as described in Example 1 was carried out.

| | |
|---|---|
| Copolymer 3 of Reference Example 3 | 7.0 g |
| Polyacetal 1 of Reference Example 8 | 3.0 g |
| α,α-Bis(p-chlorophenyl)diazomethane | 0.2 g |
| PGMEA | 40 g |

The positive pattern had a wall angle of 87°, the resolution of line and space was 0.3 µm, and the exposure energy was 10 mJ/cm².

Example 7

The procedure of Example 1 was repeated to prepare a resist composition according to the following formulation, and the same experiment as described in Example 1 was carried out.

| | |
|---|---|
| Copolymer 2 of Reference Example 2 | 4.08 g |
| Polyacetal 1 of Reference Example 8 | 2.72 g |
| α,α-Bis(p-chlorophenyl)diazomethane | 0.136 g |
| 0.1 mmol/g solution of triphenylsulfonium acetate in PGMEA | 2.09 g |
| PGMEA | 10.63 g |

The positive pattern had a wall angle of 87°, the resolution of line and space was 0.24 µm, and the exposure energy was 40 mJ/cm².

Example 8

The procedure of Example 1 was repeated to prepare a resist composition according to the following formulation, and an experiment was carried out in the same manner as in Example 1, except that the prebaking temperature was increased to 140° C.

| | |
|---|---|
| Homopolymer (PHS) of Reference Example 7 | 5.85 g |
| Polyacetal 2 of Reference Example 9 | 3.15 g |
| α,α-Bis(p-chlorophenyl)diazomethane | 0.168 g |
| 0.1 mmol/g solution of triphenylsulfonium acetate in PGMEA | 2.76 g |
| PGMEA | 18.5 g |

The positive pattern had a wall angle of 85°, the resolution of line and space was 0.3 µm, and the exposure energy was 55 mJ/cm².

Example 9

The procedure of Example 1 was repeated to prepare a resist composition according to the following formulation, and the same experiment as described in Example 1 was carried out.

| | |
|---|---|
| Copolymer 1 of Reference Example 1 | 6.75 g |
| Polyacetal 2 of Reference Example 9 | 2.25 g |
| α,α-Bis(p-chlorophenyl)diazomethane | 0.188 g |
| 0.1 mmol/g solution of triphenylsulfonium acetate in PGMEA | 2.76 g |
| PGMEA | 18.5 g |

The positive pattern had a wall angle of 88°, the resolution of line and space was 0.26 μm, and the exposure energy was 50 mJ/cm².

Example 10

The procedure of Example 1 was repeated to prepare a resist composition according to the following formulation, and the same experiment as described in Example 1 was carried out.

| | |
|---|---|
| Copolymer 2 of Reference Example 2 | 16.8 g |
| Polyacetal 3 of Reference Example 10 | 7.2 g |
| α,α-Bis(p-chlorophenyl)diazomethane | 0.48 g |
| 0.1 mmol/g solution of triphenylsulfonium acetate in PGMEA | 6.14 g |
| PGMEA | 44.10 g |

The positive pattern had a wall angle of 88°, the resolution of line and space was 0.24 μm, and the exposure energy was 40 mJ/cm².

Example 11

The procedure of Example 1 was repeated to prepare a resist composition according to the following formulation, and the same experiment as described in Example 1 was carried out.

| | |
|---|---|
| Copolymer 3 of Reference Example 3 | 7.2 g |
| Polyacetal 2 of Reference Example 9 | 1.8 g |
| α,α-Bis(p-chlorophenyl)diazomethane | 0.108 g |
| 0.1 mmol/g solution of triphenylsulfonium acetate in PGMEA | 2.76 g |
| PGMEA | 18.5 g |

The positive pattern had a wall angle of 85°, the resolution of line and space was 0.28 μm, and the exposure energy was 45 mJ/cm².

Example 12

The procedure of Example 1 was repeated to prepare a resist composition according to the following formulation, and the same experiment as described in Example 1 was carried out.

| | |
|---|---|
| Copolymer 1 of Reference Example 1 | 6.75 g |
| Polyacetal 3 of Reference Example 10 | 2.25 g |
| α,α-Bis(p-chlorophenyl)diazomethane | 0.188 g |
| 0.1 mmol/g solution of triphenylsulfonium acetate in PGMEA | 2.76 g |
| PGMEA | 18.5 g |

The positive pattern had a wall angle of 89°, the resolution of line and space was 0.3 μm, and the exposure energy was 48 mJ/cm².

Example 13

A resist composition was prepared according to the following formulation.

| | |
|---|---|
| Copolymer 1 of Reference Example 1 | 8.0 g |
| Benzyl alcohol derivative of hexahydroxymelamine crosslinking agent | 2.0 g |
| Triphenylsulfonium trifluoromethylsulfonate | 0.5 g |
| PGMEA | 40 g |

The solution thus obtained was agitated and filtered through 0.5 and 0.2-μm filters to remove particles. The filtrate was spin-coated on a silicon wafer at 4,000 rpm, and the resultant coating was prebaked at a temperature of 130° C. for 60 sec. The thickness of the resultant film was 0.7 μm. The coated silicon base material thus obtained was selectively exposed to an electron beam at an accelerating voltage of 30 Kev. The exposed, coated silicon wafer was baked on a hot plate at 90° C. for 60 sec and developed with an alkaline developer (2.38 wt % tetramethylammonium hydroxide) for 60 sec, thereby dissolving and removing the unexposed area alone of the resist material. Thus, a negative pattern was obtained. The negative pattern had a wall angle of 88°, the resolution of line and space was 0.15 μm, and the exposure energy was 20 mJ/cm².

Example 14

The procedure of Example 13 was repeated to prepare a resist composition according to the following formulation, and the same experiment as described in Example 13 was carried out.

| | |
|---|---|
| Copolymer 4 of Reference Example 4 | 7.5 g |
| Benzyl alcohol derivative of hexahydroxymelamine crosslinking agent | 2.5 g |
| Triphenylsulfonium hexafluoropropanesulfonate | 0.5 g |
| PGMEA | 40.0 g |

The negative resist had a wall angle of 90°, the resolution of line and space was 0.14 μm, and the exposure energy was 30 mJ/cm².

Example 15

The procedure of Example 1 was repeated to prepare a resist composition according to the following formulation, and the same experiment as described in Example 1 was carried out.

| | |
|---|---|
| Copolymer 1 of Reference Example 1 | 5.85 g |
| 1,1,1-Tris(t-butoxycarbonyl-oxyphenyl)ethane | 3.15 g |
| Triphenylsulfonium trifluoromethanesulfonate | 0.18 g |
| 0.1 mmol/g solution of triphenylsulfonium acetate in PGMEA | 2.76 g |
| PGMEA | 18.50 g |

The positive pattern had a wall angle of 85°, the resolution of line and space was 0.3 μm, and the exposure energy was 40 mJ/cm².

Example 16

The procedure of Example 1 was repeated to prepare a resist composition according to the following formulation, and the same experiment as described in Example 1 was carried out.

| Copolymer 1 of Reference Example 1 | 5.85 g |
| --- | --- |
| 1,1,1-Tris(tetrahydropyranyl-oxyphenyl)ethane | 3.15 g |
| Triphenylsulfonium trifluoromethanesulfonate | 0.18 g |
| 0.1 mmol/g solution of triphenylsulfonium acetate in PGMEA | 2.76 g |
| PGMEA | 18.50 g |

The positive pattern had a wall angle of 85°, the resolution of line and space was 0.32 µm, and the exposure energy was 50 mJ/cm².

Example 17

A resist composition was prepared according to the following formulation.

| Copolymer 1 of Reference Example 1 | 5.85 g |
| --- | --- |
| Polyacetal 1 of Reference Example 8 | 3.15 g |
| Triphenylsulfonium trifluoromethanesulfonate | 0.18 g |
| 0.1 mmol/g solution of triphenylsulfonium acetate in PGMEA | 2.76 g |
| PGMEA | 18.50 g |

The mixture thus obtained was agitated for not shorter than 1 hr and filtered through 0.5 and 0.2-µm filters to remove particles. The filtrate was spin-coated on a silicon wafer, and the resultant coating was prebaked at a temperature of 130° C. for 60 sec. The thickness of the resultant film was 0.746 µm. The coated silicon wafer thus obtained was selectively exposed to an electron beam at an accelerating voltage of 30 Kev. The exposed, coated silicon base material was baked on a hot plate at 60° C. for 60 sec and developed with an alkaline developer (2.38 wt % tetramethylammonium hydroxide) for 60 sec, thereby dissolving and removing the exposed area alone of the resist material. Thus, a positive pattern was obtained. The positive pattern had a wall angle of 90°, the resolution of line and space was 0.15 µm, and the exposure energy was 30 mJ/cm².

What is claimed is:

1. A radiation sensitive composition comprising a) a copolymer represented by the formula:

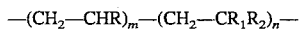

$-(CH_2-CHR)_m-(CH_2-CR_1R_2)_n-$ where R is a hydroxy-substituted aryl, wherein R is or is not further substituted with alkyl, where the hydroxyl group is or is not partially protected by an acid cleavable group, $R_1$ is hydrogen or a methyl group, $R_2$ is a phenyl, alkyl-substituted phenyl, halogenated phenyl, or acrylate group, and m and n are integers of 1 or more, b) a polyacetal represented by the general formula:

$-(CHR_3-O-R_4-X-NR_5)_p-$ $R_3$ is an alkyl, aryl, or substituted aryl group, $R_4$ is an alkylene, cycloalkylene, alkene, or alkyne group, $R_5$ is an alkyl, alkene, alkyne, or cycloalkyl group, X is —OCO—, —CO—, or —NHCO—, and p is an integer of 1 or more, c) a radiation sensitive compound capable of generating an acid upon exposure to actinic radiation, d) a base capable of degrading into a neutral compound upon exposure to actinic radiation, and e) a solvent for dissolving the components a), b), c), and d).

2. A radiation sensitive composition as claimed in claim 1, wherein the component a) is a copolymer of the formula in claim 1 where R is a 4-hydroxy-substituted phenyl or hydroxy- and alkyl-substituted phenyl group, wherein the hydroxy group is protected by an acid cleavable group.

3. A radiation sensitive composition as claimed in claim 1, wherein the component a) is a copolymer of 4-hydroxystyrene and styrene.

4. A radiation sensitive composition as claimed in claim 3, wherein the styrene content of the copolymer is 1 to 50 mol %.

5. A positive radiation sensitive composition as claimed in claim 1, wherein the hydroxy group in the component a) is partially substituted with a tert-butyloxycarbonyl, tetrahydropyranyl, or trialkylsilyl group.

6. A radiation sensitive composition as claimed in claim 1, wherein $R_4$ is ethylene, isopropylene, or branched butylene, $R_3$ is phenyl, $R_5$ is propyl, and X is OCO group.

7. A radiation sensitive composition as claimed in claim 1, wherein the actinic radiation used for exposure is deep UV light, electron beams, or X-rays.

8. A radiation sensitive composition as claimed in claim 1, wherein the component c) is represented by the formulas:

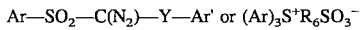

$Ar-SO_2-C(N_2)-Y-Ar'$ or $(Ar)_3S^+R_6SO_3^-$ where Ar and Ar' which are the same or different, are a phenyl, chlorophenyl, alkylphenyl, or alkyl group, Y is —$SO_2$— or —CO—, and $R_6$ is an alkyl or fluorinated alkyl group.

9. A radiation sensitive composition as claimed in claim 1, wherein the component d) is represented by the formula:

$(Ar)_3S^+CH_3COO^-$ or $(Ar)_3S^+OH^-$ wherein Ar is a phenyl group which is or is not substituted.

10. A radiation sensitive composition as claimed in claim 1, wherein the component e) is propyleneglycol monomethylether acetate (PGMEA).

11. A radiation sensitive composition comprising a) a copolymer represented by the formula of the component a) in claim 1, b') a crosslinking agent, c) a radiation sensitive compound capable of generating an acid upon exposure to actinic radiation, d) a base capable of degrading into a neutral compound upon exposure to actinic radiation, and e) a solvent for dissolving the components a), b'), c), and d).

12. A radiation sensitive composition as claimed in claim 11, wherein the component a) is a copolymer of the formula in claim 1 where R is a 4-hydroxy-substituted phenyl or hydroxy- and alkyl-substituted phenyl group, wherein the hydroxy group is protected by an acid cleavable group.

13. A radiation sensitive composition as claimed in claim 11, wherein the component a) is a copolymer of 4-hydroxystyrene and styrene.

14. A radiation sensitive composition as claimed in claim 13, wherein the styrene content of the copolymer is 1 to 50 mol %.

15. A radiation sensitive composition as claimed in claim 11, wherein the actinic radiation used for exposure is deep UV light, electron beams, or X-rays.

16. A radiation sensitive composition as claimed in claim 11, wherein the component c) is represented by the formulas:

$$Ar-SO_2-C(N_2)-Y-Ar' \text{ or } (Ar)_3S^+R_6SO_3^-$$

where Ar and Ar' which may be the same or different is a phenyl, chlorophenyl, alkylphenyl, or alkyl group, Y is $-SO_2-$ or $-CO-$, and $R_6$ is an alkyl or fluorinated alkyl group.

17. A radiation sensitive composition as claimed in claim 11, wherein the component d) is represented by the formula:

$$(Ar)_3S^+CH_3COO^- \text{ or } (Ar)_3S^+OH^-$$

wherein Ar is a phenyl group which may be substituted.

18. A radiation sensitive composition as claimed in claim 11, wherein the component e) is propyleneglycol monomethylether acetate (PGMEA).

* * * * *